United States Patent
Sharda et al.

(10) Patent No.: US 9,190,989 B1
(45) Date of Patent: Nov. 17, 2015

(54) INTEGRATED CIRCUIT POWER MANAGEMENT

(71) Applicants: Garima Sharda, Ghaziabad (IN); Carl Culshaw, Wigan (GB); Alan Devine, Paisley (GB); Akshay K. Pathak, Noida (IN); Alistair P. Robertson, Glasgow (GB)

(72) Inventors: Garima Sharda, Ghaziabad (IN); Carl Culshaw, Wigan (GB); Alan Devine, Paisley (GB); Akshay K. Pathak, Noida (IN); Alistair P. Robertson, Glasgow (GB)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/509,046

(22) Filed: Oct. 7, 2014

(51) Int. Cl.
  G05F 1/10 (2006.01)
  H03K 3/012 (2006.01)
  G05F 1/66 (2006.01)

(52) U.S. Cl.
  CPC . *H03K 3/012* (2013.01); *G05F 1/66* (2013.01)

(58) Field of Classification Search
  CPC ........ G06F 1/3293; G06F 15/80; G06F 15/82
  See application file for complete search history.

(56) References Cited

U.S. PATENT DOCUMENTS

| | | | |
|---|---|---|---|
| 7,925,900 B2 * | 4/2011 | Parks | G06F 1/3203 712/1 |
| 8,010,822 B2 | 8/2011 | Marshall et al. | |
| 8,020,017 B2 | 9/2011 | Padhye et al. | |
| 8,219,843 B2 | 7/2012 | Cheng | |
| 8,381,004 B2 | 2/2013 | Elnozahy et al. | |
| 8,543,857 B2 | 9/2013 | Therien | |
| 8,615,647 B2 * | 12/2013 | Hum | G06F 1/3203 712/32 |
| 8,832,478 B2 * | 9/2014 | Ananthakrishnan | G06F 1/324 713/320 |
| 9,021,284 B2 * | 4/2015 | Freiwald | G06F 1/3293 713/300 |
| 2005/0144434 A1 | 6/2005 | Taylor | |
| 2006/0212677 A1 | 9/2006 | Fossum | |
| 2011/0320766 A1 | 12/2011 | Wu | |
| 2013/0031386 A1 * | 1/2013 | Tanaka | G06F 1/3265 713/300 |

OTHER PUBLICATIONS

Hattori, T., et al., "A Power Management Scheme Controlling 20 Power Domains for a Single-Chip Mobile Processor", International Solid-State Circuits Conference 2006—Digest of Technical Papers—IEEE International, Feb. 6-9, 2006.

Renesas Electronics America Inc., "Microcontrollers Solutions Enabling a Greener Society", DEVCON, Oct. 22-25, 2012, (http://www.renesasinteractive.com/file.php/1/CoursePDFs/DevCon_On-the-Road/DevCon_On-the-Road/Computing_Architecture/Microcontrollers%20Solutions%20Enabling%20a%20Greener%20Society.pdf).

U.S. Appl. No. 14/321,838, filed Jul. 2, 2014 and assigned to Freescale Semiconductor, Inc.

* cited by examiner

*Primary Examiner* — Jeffrey Zweizig
(74) *Attorney, Agent, or Firm* — Charles Bergere

(57) ABSTRACT

A power management system permits a small microcontroller subsystem or low power domain to continuously operate while a main subsystem domain is cycling from power on to off. The power management system supports asynchronous domains with common shared peripherals. The asynchronous domains operate as a single entity while in a full power mode with the peripheral and system resources being shared. The system can be used in automotive systems where most of the system is power-gated leaving just a power regulator controller, some counters and an input/output segment alive for wakeup purposes.

15 Claims, 3 Drawing Sheets

INTEGRATED CIRCUIT POWER MANAGEMENT

BACKGROUND OF THE INVENTION

The present invention relates generally to power management, and more particularly, to systems and methods for power management of different functional modes of operation of an integrated circuit such as a multi-core System on Chip (SOC).

To manage power consumption, an SoC may be partitioned into various power domains such that each peripheral belongs to one of the power domains. An SoC will further have multiple modes where some of the peripherals will be active and some will be powered off. The mode where only a minimum required set of peripherals are active, is referred to as a Standby mode. The subset of the modules that are always alive are referred to as being in the alive domain and the subset of the modules that are power gated are referred to as being in the power gated domain. Typically, isolation cells are used to isolate the alive domain from the power gated domain. The different functional modes of operation typically reside in different power domains and have different power requirements. Switching between modes typically involves stopping, pausing or re-setting various modules or peripherals comprising the SOC during a transition. These methods may interrupt operation of peripherals during a transition. These discontinuities in operation are undesirable for the end user of the system. Thus, it would be advantageous to provide a means for switching between modes having different power requirements, in a non-intrusive and easily managed manner from the end user's point of view, whereby continuity of operation of peripherals can be maintained. It would also be advantageous to minimize the time taken to switch between modes.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
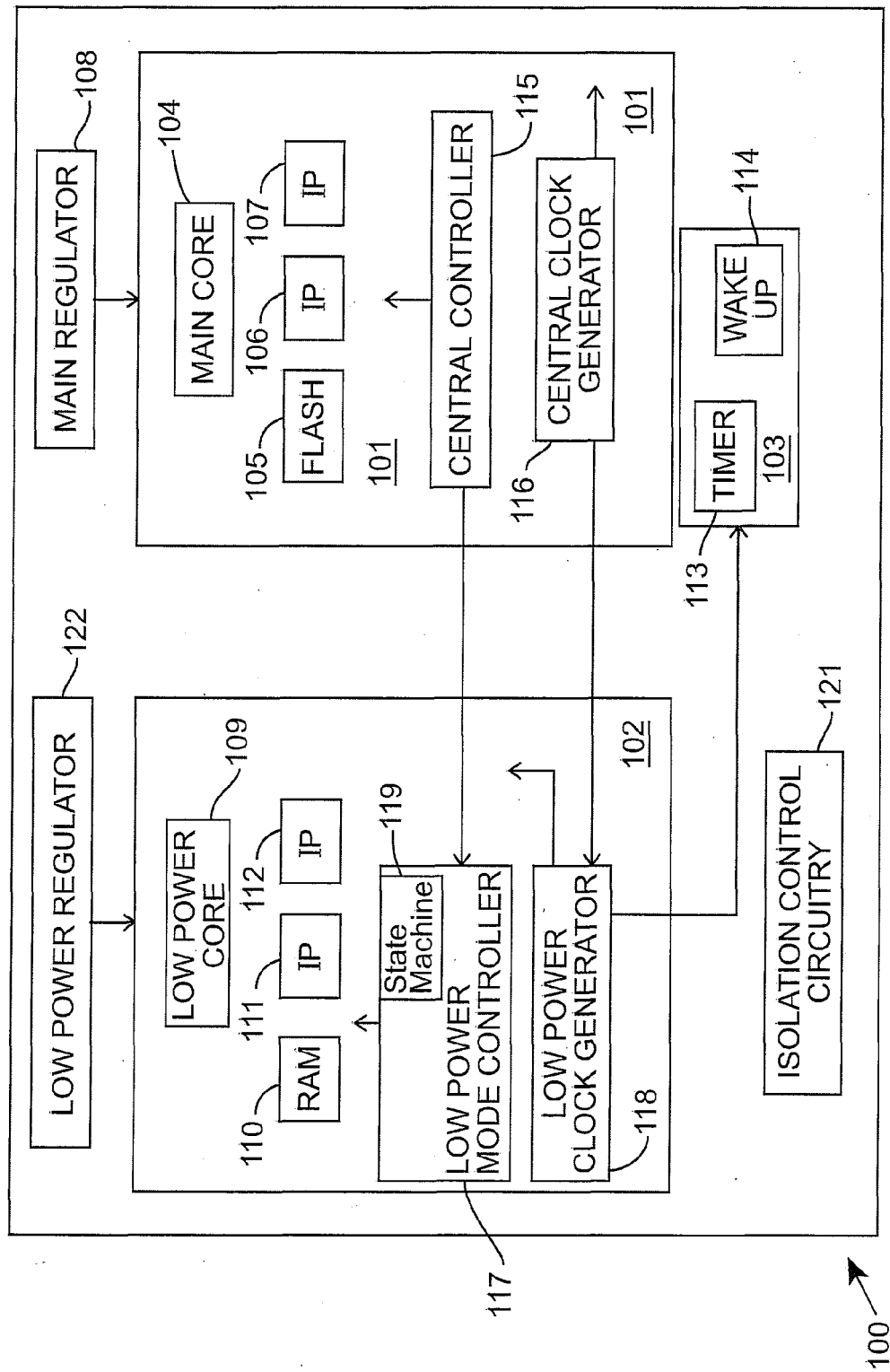
FIG. 1 is a schematic block diagram of an integrated circuit in accordance with the invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a method of power management of an integrated circuit (IC), where the IC has a main domain and a low power domain and capable of operating in a full power mode of operation in which both the main domain and low power domain are active and a low power mode of operation in which the main domain is inactive and the low power domain is active. The method comprises: operating the IC in the full power mode under the control of a central controller; receiving a first instruction to switch from the full power mode to the low power mode of operation; switching control of the low power domain from the central controller to the a low power mode controller, gating the main domain so that it is inactive, receiving a second instruction to revert to the full power mode, and subsequently controlling the main domain with the central controller and continuing to control the low power domain with the low power mode controller.

In another embodiment, the present invention provides an integrated circuit including a main domain and a low power domain and capable of operating in a full power mode of operation in which both the main domain and low power domain are active and a low power mode of operation in which the main domain is inactive and the low power domain is active. The low power domain includes a low power domain mode controller for controlling operation of the low power domain when operating in the low power mode and being arranged to continue controlling the low power domain on receipt of an instruction to switch from the low power mode to the full power mode.

The invention can provide a method for switching between a full power mode of operation where two domains are running synchronously, a low power mode where just one domain is operating or alive, and another full power mode where two domains are running asynchronously. A low power mode may comprise a reduced computing mode in which a small microcontroller subsystem (SMS) is operational but the main domain is gated. Thus, in effect, the invention supports various modes where an SOC is operating as a singular (full power subsystem), one or more low power subsystems or an asynchronous (full power) subsystem whereby each subsystem supports multiple power domains while switching between full power ("run") and low power modes.

The invention permits the integrated circuit to transition from a full power mode to a "wait" or a "stop" mode while all domains are still powered or to a "standby" mode. The invention also permits the integrated circuit to transition from a low power mode to a "stop" or a "wait" mode while just the low powered domain is powered or to a "standby" mode. The invention also permits transitioning from an asynchronous full power mode to a synchronous full power mode, optionally moving through a "standby" mode in the process. These mode transitions may be represented in a state machine.

Advantageously, the invention permits a small microcontroller subsystem (SMS) or low power domain to continuously operate while a main subsystem domain is cycling from power on to off. When switching between low power and full power modes of operation, a main domain core and an SMS domain core can handshake based on a software interrupt. The invention also provides for switching between clock sources and data paths and the isolation of power domains on the fly.

In one example, the invention provides an architecture which supports asynchronous domains with common shared peripherals. The asynchronous domains operate as single entity while in a full power run mode with the peripheral and system resources being shared. As the peripherals and network fabric in both full power and low power modes are shared, there is no duplication of logic. The invention permits dynamic switching to multiple asynchronous power domains. In one embodiment, a main domain is kept power-gated while other (low power) subsystem domains operate on hierarchical controllers. On reverting to full power mode, the subsystem domains are switched back to a central controller. On moving from a full power mode of operation to a low power mode (or reduced computing mode), an SMS subsystem can take over control of necessary peripherals without disturbing any ongoing transactions. Hence, switching from a main run mode to a low power run mode is seamless from the perspective of peripherals operating in the low power run mode.

Referring now to FIG. 1, a System on Chip device 100 in accordance with an embodiment of the present invention is shown. In this example, the SOC 100 has a first (main) domain 101, a second (low power) domain 102 and a third, alive domain 103. The main domain includes a (main) core 104, a flash memory 105 and two functional ("IP") modules 106, 107. Typically such a main domain may include further modules but in FIG. 1 just three are shown for the sake of clarity. The main domain is alive in a full power mode of operation only. A main regulator 108 can supply the main domain 101 and the low power domain 102 with a regulated voltage supply under certain operating conditions.

The second domain 102 in this example is an SMS domain which is alive in both a full power mode of operation and in a reduced computing mode of operation. The second domain 102 includes a low power core 109, a Random Access Memory (RAM) 110 and two functional IP modules 111, 112. Typically such a domain may include further modules but in FIG. 1 just three are shown for the sake of clarity.

The third domain 103 in this example is an "always on" or "standby" domain which can be alive even when both the first and second domains 101, 102 are inactive. Typically, the third domain includes several timer modules, wake-up circuitry and corresponding state machines as required to control power and isolations. FIG. 1 shows one timer module 113 and wake-up circuitry 114.

The main domain 101 also includes a central controller 115 which controls an operating mode of the SOC and a central clock generator 116. The SMS domain 102 also includes low power mode controller 117 which controls the SMS domain in a reduced computing mode of operation and in a full power, asynchronous subsystem mode of operation. The SMS domain 102 also includes a low power clock generator 118. The low power mode controller 117 is operably coupled to the central controller 115. The low power clock generator 118 is operably coupled to the central clock generator 116 and to the third domain 103. The central clock generator 116 and the low power clock generator 118 form a hierarchical clocking system. The central controller 115 and low power mode controller 117 form a hierarchical mode control system. The low power mode controller 117 includes a state machine 119 for controlling mode transitions. The SOC 100 includes isolation control circuitry 121. The isolation circuitry allows crossings between the main domain 101 and the low power domain 102 when they are operating asynchronously. The SOC also includes a low power regulator 122 which supplies the low power domain 102 with a regulated voltage supply under certain operating conditions.

The SOC 100 can make power mode transitions and can switch between synchronous and asynchronous modes of operation. In a synchronous, full power mode of operation, where both the main domain 101 and the SMS domain 102 are alive, both domains are controlled by the central controller 115, powered by the main regulator 108 and clocked by the central clock controller 116. In an asynchronous, full power mode of operation, where both the main domain 101 and the SMS domain 102 are alive, the main domain 101 is controlled by the central controller 115, powered by the main regulator 108 and clocked by the central clock controller 116 but the SMS domain is controlled by the low power controller 117, powered by the low power regulator 118 and clocked by the low power clock generator 120. In a reduced computing mode of operation, the SMS domain is alive and the main domain is power gated. The SMS domain 102 is controlled by the low power controller 117, powered by the low power regulator 118 and clocked by the low power clock generator 120.

Figure 2:
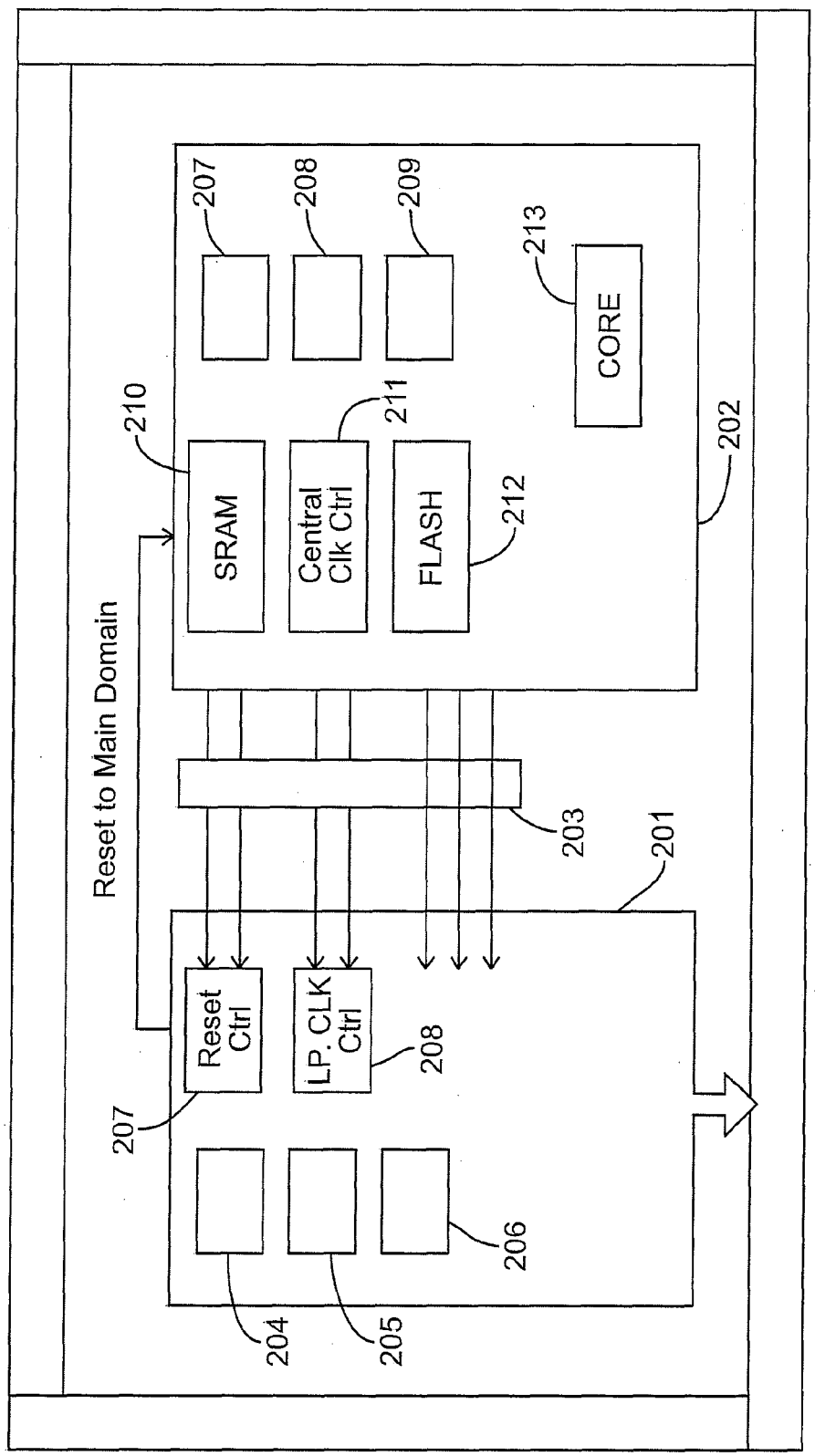
FIG. 2 is a schematic block diagram of two power domains of the integrated circuit of FIG. 1.

In FIG. 2, a first power domain 201 and a second power domain 202 of an SOC are both connected to isolation circuitry 203. In this example, the first domain is a low power or SMS domain (such as the SMS domain 102 of FIG. 1). In a first mode of operation, which is a reduced computing mode, the first domain is an alive domain and the second domain is a power-gated domain. FIG. 2 shows three exemplary peripherals 204, 205 206 in the SMS domain 201. These three peripherals 204, 205, 206 are alive. FIG. 2 shows three exemplary peripherals 207, 208, 209 in the second, power-gated domain 202. The first, SMS domain 201 also includes a reset controller module 207 and a low power clock controller 208. The power-gated domain 202 includes an SRAM 210, central clock controller 211 and flash memory 212 and a core 213. The reset controller 207 is provided for the purpose of sequencing resets to the switchable domain components (such as the core 213 and peripherals 207, 208, 209). While in an asynchronous mode (with both first and second domains alive), a reset source of the second domain may be allowed to reset the entire SOC, The low power clock controller 208 together with the central clock controller controls the switching of clock sources; that is, switching between a full power (or central) clock source and a low power clock source, the latter supplying the first domain 201. The central clock controller 211 in the second domain 202 manages the sequencing of clock enabling and disabling to the core 213 and the peripherals 207, 208, 209 of the second domain 202 during a mode transition and during Run modes. Isolation between the two domains 201 and 202 remains active when in asynchronous mode and both domains are alive. The isolation circuitry 203 can be arranged to ensure that any asynchronous crossings from the alive domain to the power-gated domain do not impact the functionality of the main domain 202. Typically, the isolation circuitry 203 includes synchronizers (not shown) which are provided to take care of meta-stability issues. These synchronizers are bypassed in a full power, singular subsystem mode and activated in a full power, asynchronous mode.

Figure 3:
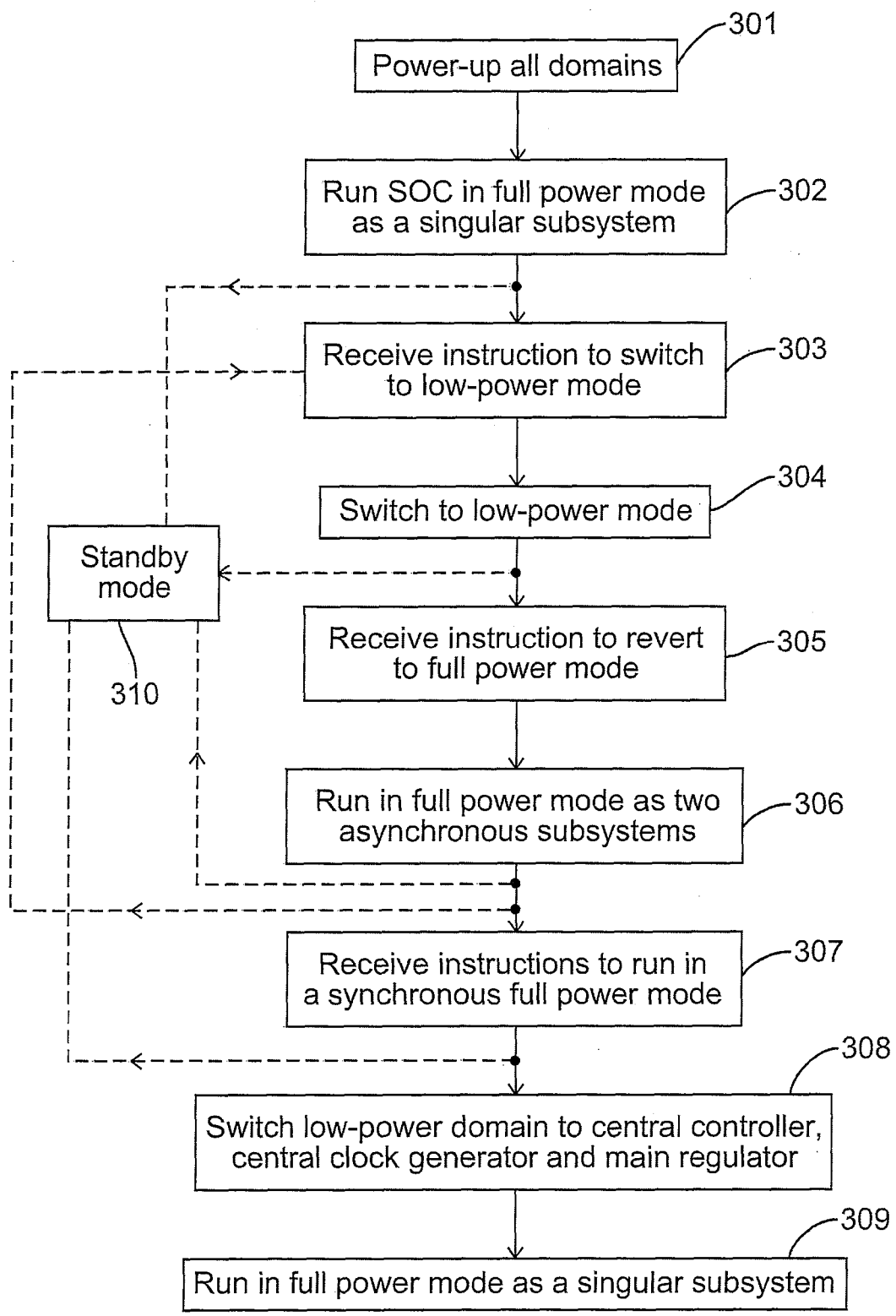
FIG. 3 is a flow chart of a method of power management in an integrated circuit in accordance with one embodiment of the invention.

A method of power management of an integrated circuit (such as the SOC described with reference to FIG. 1) by switching between full power and reduced power modes of operation will now be described with reference to the flow chart of FIG. 3 and to FIG. 1. In a full power mode of operation, both the main domain 101 and low power (SMS) domain 102 are powered up and active (i.e., alive). In a low power, reduced computing mode of operation, the main domain is inactive (i.e., power-gated) and the low power, (SMS) domain is active. Switching between full power and low power modes of operation is initiated by writing into a register in either the central controller or the low power mode controller.

At 301, all domains are powered up and at 302, the SOC runs as a singular subsystem. That is, the main domain and low power domain are run under the control of the central controller 115, receive power from the main regulator 109 and clock signals from the central clock generator 116.

At 303 the SOC generates an instruction to switch from a full power mode of operation to a low power (or reduced computing) mode of operation. This instruction is written into a register in the central controller by a core of the SOC. In an alternative embodiment, this instruction is written into the low power mode controller.

At 304 the low power mode of operation is entered which is typically one of reduced computing capability whereby only the SMS 102 is active (or alive). This transition involves switching control of the low power (SMS) domain from the central controller to the low power controller mode 117 and gating the main domain so that it becomes inactive. More specifically, the main core 104 and peripherals (eg. Flash 105 and modules 106, 107) of the main domain 101 are stopped. Generation of clocking signals is switched over to the low power clock generator 118 and IO states corresponding to the main domain are latched. An isolation layer around the stopped main domain is enabled by the isolation control circuitry 121. Power of the stopped domain is removed. The low power domain now receives power from the low power regulator 122 and clock signals from the low power clock generator 118.

At 305, an instruction, generated by a core of the SOC, to revert to a full power mode of operation is received at the low power mode controller. This instruction can be written into a register of the low power mode controller. This may be an interrupt requesting service which requires the main domain to be activated. On receipt of this instruction, signal crossings are allowed (by the isolation control circuitry 121) for initialization of the currently inactive main domain. The central clock generator 116 is enabled. Arbitration and synchronization for shared resources are enabled. The power-up sequence of the main domain is initiated. Latched IO are cleared after initialization. While the main domain is being re-enabled, all low power domain (SMS) modules continue to operate seamlessly under the control of the low power mode controller 117 and receive clock signal from the low power clock generator 118.

At 306, the SOC is now running in a full power mode as two asynchronous sub-systems. The main domain is being powered by the main regulator 108, controlled by the central controller 115 and receiving clocking signals from the central clock generator 116. The low power domain is being powered by the low-power regulator 122, controlled by the low power mode controller 117 and receiving clocking signals from the low power generator 118. Optionally, after step 306, the main domain can then go back again to a power-gated mode (step 303) and can recursively go through power cycles while any application running in the low-power domain continues to operate seamlessly. This can be controlled through the state machine 119. As a main domain can cycle while an SMS domain is active, this helps to maintain the continuity of operation.

At 307, an instruction to return to a synchronous (singular subsystem) full power mode is generated by a core of the SOC and received by either the low-power mode controller 117 or central controller 115. Following this instruction, a key-based handshake is used in order to merge the two asynchronous power subsystems into one by placing keys in the central controller 115 and in the low-power mode controller 117. For example, a key is written into the low power mode controller 117 (or into the central controller 115) and this raises an interrupt which is sent to the main core 104 of the main domain (or to the core of the low power domain). In response, the main core (or low power core) writes the key into the central controller 115 (or low power controller). A key match is done and the state machine 119 merges the two asynchronous systems into one.

At 308 a handshake completes any ongoing transactions in the low-power domain and the low-power domain switches to being controlled by the central controller 115 and being clocked by the central clock generator 116 and receiving power from the main regulator. Any isolations between the low power domain and the main domain are dissolved.

At 309 the SOC now runs in a full power mode as a singular subsystem with all cores enabled.

The SOC can transition to a standby mode of operation 310 whereby just the third domain 103 is active. This can be done after step 304 when the SOC has switched to the low power mode of operation, for example. In this case, entering a standby mode of operation can be done by gating the low power domain so that it is inactive. Then, on receipt of the instruction to revert to a full power mode of operation, the low power domain is controlled with the low power controller so that it becomes active and the method continues from step 305. Alternatively, the SOC can transition to a standby mode after step 302 or 309, that is, while running in a full power mode as a singular subsystem. Alternatively, the SOC can transition to a standby mode after step 306, that is, when running in full power mode as two asynchronous subsystems. Alternatively, the SOC can move through a standby mode whilst transitioning from an asynchronous full power mode of operation to a synchronous, full power mode of operation, that is, after receiving the instruction at step 307.

It will be noted that advantageously, the transition time involved in switching from a low power mode to a full power mode is reduced when employing the asynchronous power subsystem arrangement of the present invention because the transition does not require the SOC to go through a quiescent stage but can occur once the main domain has been properly primed.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected" or "operably coupled" to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Further, the entire functionality of the modules shown in FIG. 1 may be implemented in an integrated circuit. Such an integrated circuit may be a package containing one or more dies. Alternatively, the examples may be implemented as any number of separate integrated circuits or separate devices interconnected with each other in a suitable manner. An integrated circuit device may comprise one or more dies in a single package with electronic components provided on the dies that form the modules and which are connectable to other components outside the package through suitable connections such as pins of the package and bond wires between the pins and the dies.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A method of power management of an integrated circuit, wherein the integrated circuit comprises a main domain and a low power domain, and is capable of operating in a full power mode of operation in which both the main domain and low power domain are active and a low power mode of operation in which the main domain is inactive and the low power domain is active, the method comprising:
   operating the integrated circuit in the full power mode under the control of a central controller;
   receiving a first instruction to switch from the full power mode to the low power mode;
   switching control of the low power domain from the central controller to a low power mode controller;
   gating the main domain so that the main domain is inactive; and
   receiving a second instruction to revert to the full power mode and subsequently controlling the main domain with the central controller and continuing to control the low power domain with the low power mode controller.

2. The method of claim 1, further comprising:
   providing first clock signals to the main and low power domains from a main clock generator in the full power mode under the control of the central controller;
   gating the first clock signals provided by the main clock generator; and
   providing second clock signals to the low power domain from a low power domain clock generator on switching to the low power mode; and
   on receiving the second instruction to revert to the full power mode, providing the first clock signals to the main domain from the main clock generator and continuing to provide the second clock signals to the low power domain from the low power domain clock generator.

3. The method of claim 1, further comprising:
   supplying power to the main and low power domains from a main voltage regulator in the full power mode under control of the central controller;
   disabling the main voltage regulator and providing power to the low power domain from a low power domain voltage regulator on switching to the low power mode; and
   on receiving the second instruction to revert to the full power mode, supplying power to the main domain from the main voltage regulator and continuing to supply power to the low power domain from the low power domain voltage regulator.

4. The method of claim 1, wherein the first instruction is generated by a core of the integrated circuit.

5. The method of claim 4, wherein the switching operation is initiated upon writing the first instruction into a register of the integrated circuit by the core.

6. The method of claim 1, further comprising, after reverting to the full power mode, handing over control of the low power domain from the low power controller to the central controller.

7. The method of claim 6, wherein handing over control of the low power domain from the low power controller to the central controller comprises:
   a core of the low power domain writing a first key into the low power mode controller;
   generating an interrupt signal; and
   sending the interrupt signal to a core of the main domain and subsequently writing a second key into the central controller for matching against the first key written into the low power mode controller.

8. The method of claim 6, wherein handing over control of the low power domain from the low power controller to the central controller comprises:
   a core in the main domain writing a first key into the central controller;
   generating an interrupt signal;
   sending the interrupt signal to a core of the low power domain; and
   writing a second key into the low power mode controller for matching against the first key written into the central controller.

9. The method of claim 1, further comprising:
   cycling the main domain between power on and power off modes whilst keeping the low power domain active under the control of the low power mode controller.

10. The method of claim 1, further comprising:
    after gating the main domain and prior to receiving the second instruction to revert to the full power mode, entering a standby mode of operation by gating the low power domain so that the low power domain is inactive; and upon receipt of the second instruction to revert to the full power mode, controlling the low power domain with the low power controller so that the low power domain becomes active.

11. The method of claim 1, comprising:
entering a standby mode of operation after reverting to the full power mode.

12. The method of claim 1, comprising:
entering a standby mode of operation after reverting to the full power mode and handing over control of the low power domain from the low power controller to the central controller.

13. An integrated circuit, comprising:
a main domain that is active in a full power mode of operation and inactive in a low power mode of operation;
a low power domain that is active in both the full and low power modes of operation; and
a low power domain mode controller, located in the low power domain, for controlling operation of the low power domain when operating in the low power mode and arranged to continue controlling the low power domain on receipt of a first instruction to switch from the low power mode of operation to the full power mode of operation.

14. The integrated circuit of claim 13, wherein the low power mode controller includes a register for receiving the first instruction.

15. The integrated circuit of claim 13, further comprising:
a central controller for controlling the main domain and wherein the low power domain mode controller is further arranged, on receipt of a second instruction, to hand over control of the low power domain to the central controller.

* * * * *